United States Patent
Li et al.

(10) Patent No.: US 7,683,733 B2
(45) Date of Patent: Mar. 23, 2010

(54) BALUN TRANSFORMER WITH IMPROVED HARMONIC SUPPRESSION

(75) Inventors: Qiang Li, Gilbert, AZ (US); Jonathan K. Abrokwah, Chandler, AZ (US); Olin L. Hartin, Phoenix, AZ (US); Lianjun Liu, Chandler, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 128 days.

(21) Appl. No.: 12/025,315

(22) Filed: Feb. 4, 2008

(65) Prior Publication Data

US 2009/0195324 A1 Aug. 6, 2009

(51) Int. Cl.
*H03H 7/42* (2006.01)
*H01P 5/00* (2006.01)

(52) U.S. Cl. ............................. 333/25; 333/4
(58) Field of Classification Search ................... 333/25, 333/26, 4, 177; 455/326
See application file for complete search history.

(56) References Cited

U.S. PATENT DOCUMENTS

| 5,451,914 | A | 9/1995 | Stengel |
| 6,993,312 | B1 * | 1/2006 | Salib ........................... 455/326 |
| 7,034,630 | B2 | 4/2006 | Rijks |
| 7,253,712 | B1 | 8/2007 | Papananos |
| 2008/0258837 | A1 | 10/2008 | Liu et al. |

OTHER PUBLICATIONS

International Search Report for coordinating PCT Application No. PCT/US09/30247 mailed Mar. 18, 2009.
Mondal, J., et al., Design and Characterization of a Integrated Passive Balun for Quad Band GSM Applications, IEEE, 2006 Electronic Components and Technology Conference, pp. 534-540, Jun. 2006.

* cited by examiner

*Primary Examiner*—Dean O Takaoka
(74) *Attorney, Agent, or Firm*—Ingrassia, Fisher & Lorenz, P.C.

(57) ABSTRACT

An electronic assembly includes a substrate (66), a balun transformer (42) formed on the substrate (66) and including a first winding (50) and a second winding (52), each having respective first and second ends, and a reaction circuit component (48) formed on the substrate (66) and electrically coupled to the second winding (52) between the first and second ends thereof. The balun transformer (42) and the reaction circuit component (48) jointly form a harmonically suppressed balun transformer having a fundamental frequency, and the reaction circuit component (48) is tuned such that the harmonically suppressed balun transformer resonates at a selected harmonic of the fundamental frequency.

14 Claims, 5 Drawing Sheets

BALUN TRANSFORMER WITH IMPROVED HARMONIC SUPPRESSION

FIELD OF THE INVENTION

The present invention generally relates to an electronic assembly and a method for forming an electronic assembly, and more particularly relates to a balun transformer with improved harmonic suppression.

BACKGROUND OF THE INVENTION

In recent years, wireless communication devices, such as cellular phones, have continued to offer an ever increasing amount of features to users, along with improved performance and computing power, while the overall size of the devices has decreased. One important component found in such devices is a type of transformer referred to as a "balun." Generally, baluns transform single-ended or "unbalanced" signals that are typically received and transmitted by antennas to differential or "balanced" signals that are typically found in the processing electronics of wireless communication devices.

Two important parameters in the design of baluns are insertion loss and common mode rejection, as they determine the value selection and layout of the transformer and capacitors. Thus, baluns are often designed with little regard to other performance factors, such as harmonic rejection. Nevertheless, good harmonic rejection is often very beneficial and important to overall circuit performance.

In order to improve harmonic rejection performance, specific harmonic filters are often added to the balun circuit. However, such harmonic filters typically increase the insertion loss, as well as the manufacturing costs, of the system and increase the overall size needed for the balun.

Accordingly, it is desirable to provide an electronic assembly that includes a balun with improved harmonic performance while avoiding the use of conventional harmonic filters. Furthermore, other desirable features and characteristics of the present invention will become apparent from the subsequent detailed description and the appended claims, taken in conjunction with the accompanying drawings and the foregoing technical field and background.

BRIEF DESCRIPTION OF THE DRAWINGS

The present invention will hereinafter be described in conjunction with the following drawings, wherein like numerals denote like elements.

DETAILED DESCRIPTION OF THE INVENTION

The following detailed description is merely exemplary in nature and is not intended to limit the invention or application and uses of the invention. Furthermore, there is no intention to be bound by any expressed or implied theory presented in the preceding technical field, background, brief summary, or the following detailed description. It should also be noted that FIGS. 1-9 are merely illustrative and may not be drawn to scale.

FIG. 1 to FIG. 9 illustrate an electronic assembly. The electronic assembly comprises a substrate, a balun transformer formed on the substrate and including a first winding and a second winding, each of the first and second windings having respective first and second ends, and a reaction circuit component formed on the substrate and electrically coupled to the second winding between the first and second ends thereof.

In one embodiment, the mid-point of the secondary winding of the balun transformer is connected to ground through reactive components (e.g., an inductor, a capacitor, or a combination thereof) that cause the circuit to resonate at the second harmonic of the fundamental frequency of the balun. The values of the added reactive components are such that when combined with the existing balun, they generate a resonance, thus a notch, in the output signal at the second harmonic frequency. As such, second harmonic suppression is significantly improved.

Figure 1:
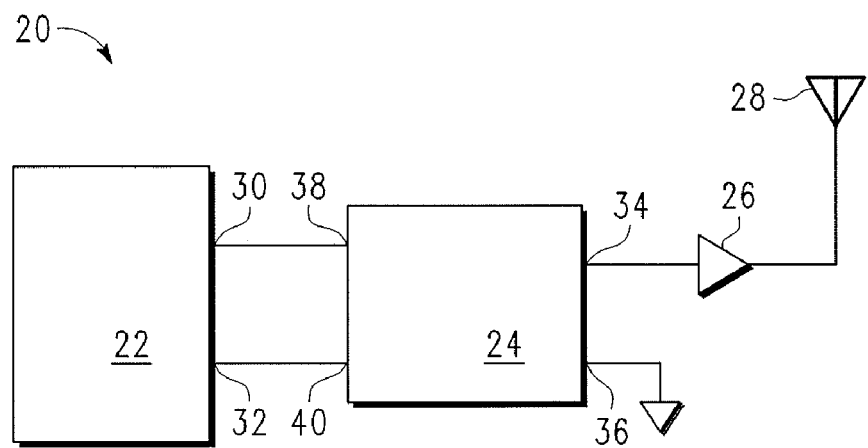
FIG. 1 is a schematic block diagram of a transmitter system according to one embodiment of the present invention.

FIG. 1 illustrates a transmitter system 20 according to one embodiment of the present invention. The system 20 includes transmitter electronics (or a transmitter) 22, a transformer circuit 24, a power amplifier 26, and an antenna 28. In one embodiment, the transmitter 22 is in the form of an integrated circuit formed on a semiconductor substrate, as is commonly understood, and includes first and second ports (i.e., inputs and/or outputs) 30 and 32, as discussed in greater detail. As shown in FIG. 1, the transformer circuit 24 includes first and second "unbalanced" (or single-ended) ports 34 and 36 and first and second "balanced" (or differential) ports 38 and 40. The antenna 28 is connected to the first unbalanced port 34 of the transformer circuit through the power amplifier 26, and the second unbalanced port 36 of the transformer circuit 24 is connected to ground (or a reference voltage). The first and second balanced ports 38 and 40 of the transformer circuit 24 are connected to the first and second ports 30 and 32 of the transmitter 22, respectively.

Figure 2:
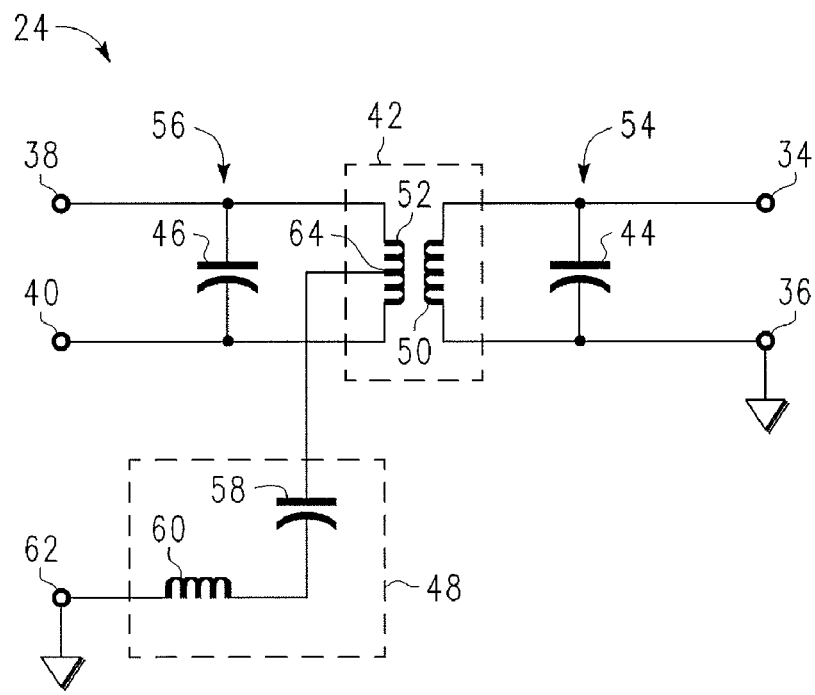
FIG. 2 is a schematic of a transformer circuit within the transmitter system of FIG. 1.
Figure 3:
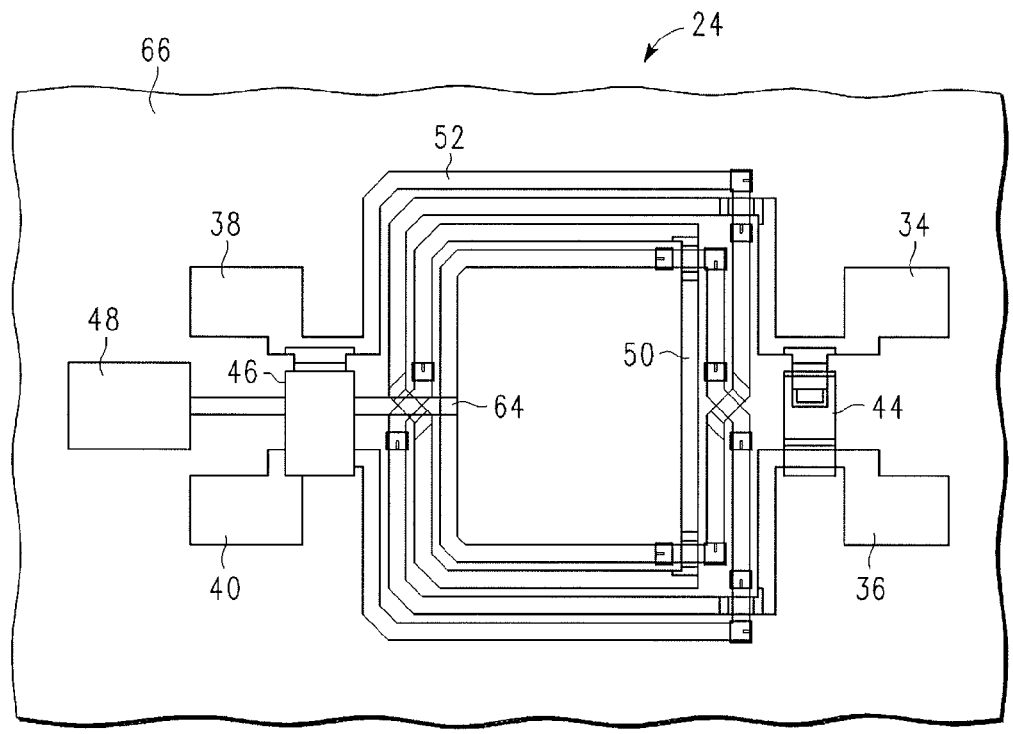
FIG. 3 is a plan view of a substrate with the transformer circuit of FIG. 2 formed thereon.

FIGS. 2 and 3 illustrate the transformer circuit 24 in greater detail. Referring to FIG. 2, the transformer circuit further includes a balun 42, first and second tuning capacitors 44 and 46, and a reaction (or resonance) circuit 48. The balun 42 includes first and second windings (or coils) 50 and 52 on respective first and second sides 54 and 56 of the transformer circuit 24. As will be appreciated by one skilled in the art, the first side 54 of the transformer circuit 24 (or the balun 42) is "unbalanced," while the second side 56 is "balanced." The first tuning capacitor 44 is connected across opposing ends (not specifically shown) of the first winding 50 and between the first and second unbalanced ports 34 and 36, and the second tuning capacitor 46 is connected across the opposing ends of the second winding 52 and between the first and second balanced ports 38 and 40.

The reaction circuit 48 includes a resonance capacitor 58 and a resonance inductor 60 (i.e., two reaction circuit components) connected in series between the second winding 52 of the balun 42 and a reference terminal (or reference voltage) 62. The reaction circuit 48 is connected to the second winding 52 between the ends thereof, and more particularly, is connected a mid-point (e.g., a center-tap) 64 of the second winding 52. The electrical values (i.e., capacitance and inductance) of the resonance capacitor 58 and the resonance inductor 60 are selectively chosen such that the balun 42, the tuning capacitors 44 and 46, and the reaction circuit 48 jointly form a harmonically suppressed balun transformer, as describe in greater detail below. The harmonically suppressed balun transformer has a fundamental frequency, for example, of 2.450 Gigahertz (GHz).

As shown in FIG. 3, the transformer circuit 24 is formed on a substrate 66, such as a semiconductor substrate made primarily of silicon (Si), germanium (Ge), gallium arsenide (GaAs), or a combination thereof. The substrate 66 may be a semiconductor wafer with a diameter of, for example, approximately 150, 200, or 300 millimeters (mm) and divided into multiple die, or "dice." The substrate 66 is used with complimentary metal-oxide-semiconductor (CMOS), integrated passive device process, or other semiconductor process for forming the circuit 24 on a chip. The substrate 66 defines a circuit plane where etching, deposition, or other techniques are used to form the circuit transformer circuit 24 in one or more layers.

The first and second windings 50 and 52 are conductive traces made of, for example, aluminum (Al), copper (Cu), gold (Au), or any practical combination thereof (e.g., AlCu) and formed using, for example, thermal or electron beam evaporation, physical vapor deposition (PVD), CVD, atomic layer deposition (ALD), or electroplating. The tuning capacitors 44 and 46, as well as the resonance capacitor 58 (FIG. 2), may be metal-insulator-metal (MIM) capacitors, as are commonly understood, and include two conductive plates on opposing sides of an insulating body (e.g., made of silicon nitride).

Figure 4:
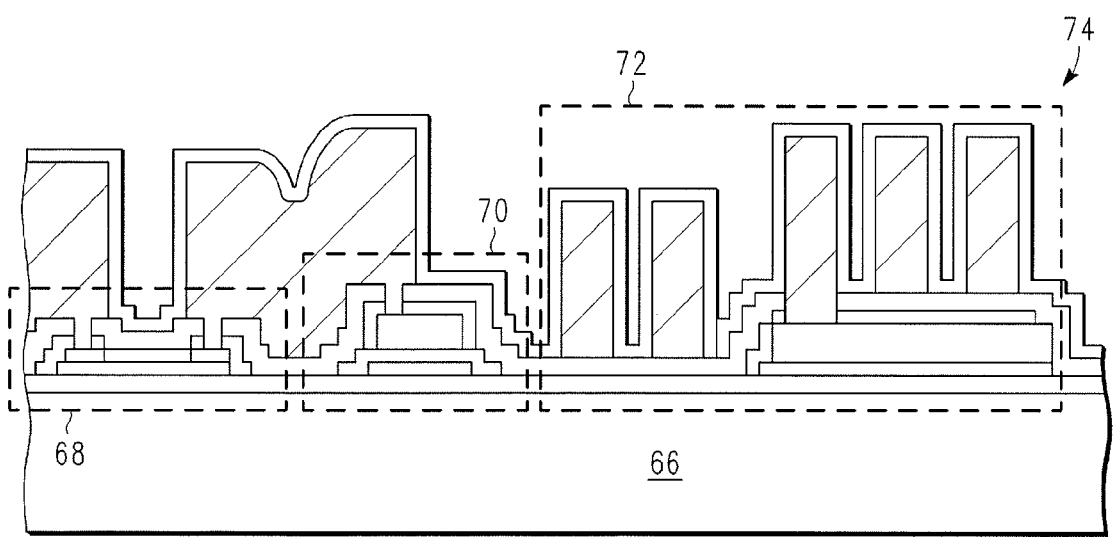
FIG. 4 is a cross-sectional side view of a integrated passive device (IPD)

FIG. 4 is an expanded view of the substrate 66. As shown, various electronic components may be formed on the substrate 66, such as thin film (TF) resistor(s) 68, inductor(s) 70, and MIM capacitor(s) 72. As will be appreciated by one skilled in the art, the TF resistor 68 and the inductor 70 may be at least partially formed during the same processing steps used to form the transformer circuit 24 shown in FIGS. 1-3. Although not specifically shown, multiple components, formed on the substrate 66 may be coupled such that harmonic filters, couplers, switches, and additional transformers are formed therefrom. The electronic components shown in FIG. 3 combined with the transformer circuit 24 of FIG. 2 may form a microelectronic, or electronic, assembly, or integrated passive device (IPD) 74. The IPD 74 may be a discrete component with no other electronics formed on the substrate 66. Alternatively, the transmitter 22 may be formed on the substrate 66 with the IPD 74.

Figure 5:
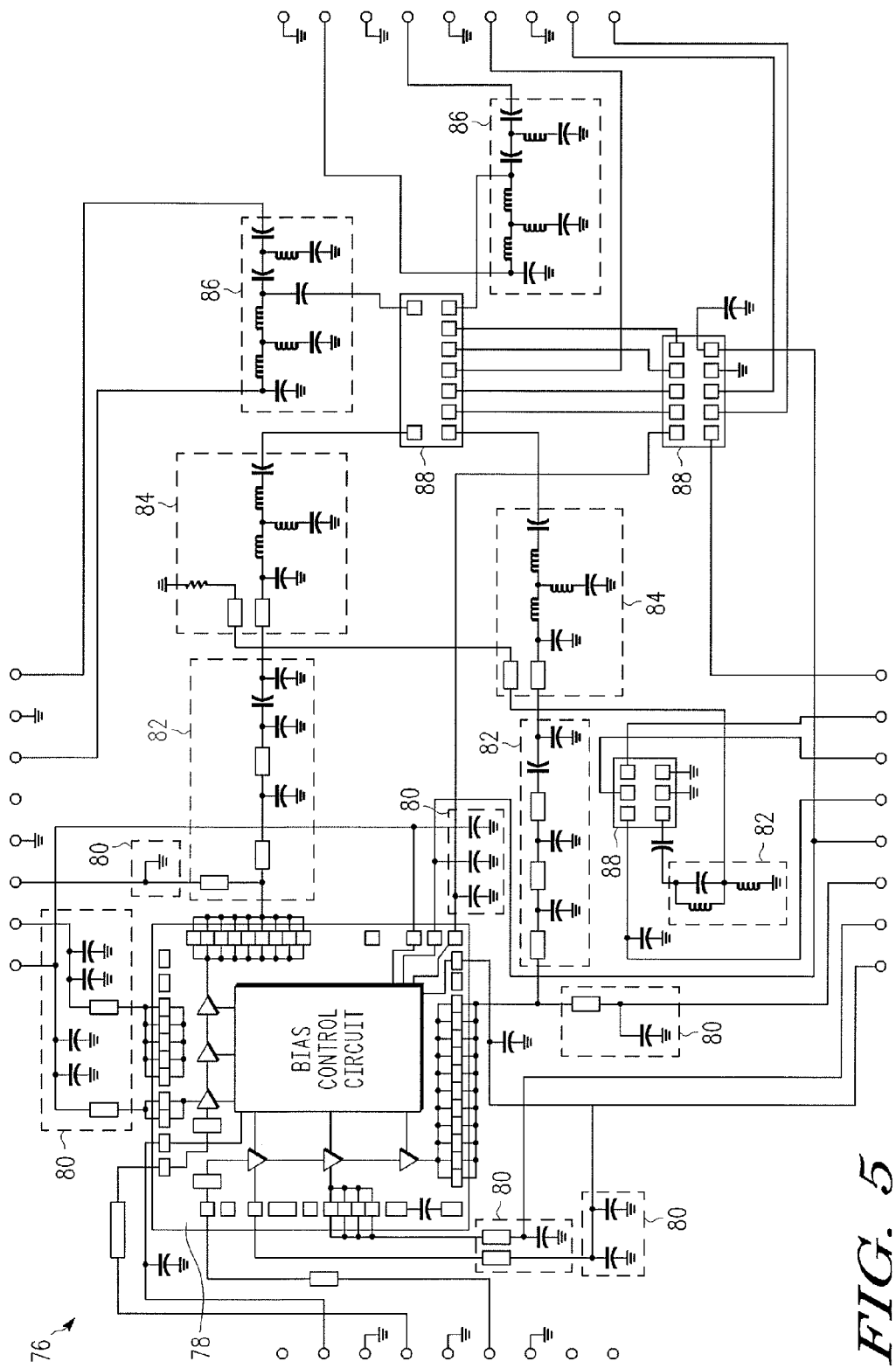
FIG. 5 is a schematic view of a power amplifier (PA) module in which the IPD of FIG. 4 may be utilized.

After final processing steps, which may include the formation of contact formations (e.g., solder balls) and conductors (e.g., wire bonds) interconnecting the electronic components and the contact formations, the substrate 66 may be sawed into the individual microelectronic dice (or IPDs or semiconductor chips), which are packaged and installed in various electronic or computing systems. FIG. 5 schematically illustrates an exemplary power amplifier (PA) module 76 in which the IPD 74 may be utilized. In the depicted embodiment, the PA module 76 includes a power amplifier (or power integrated circuit) 78, decoupling circuits 80, matching/tuning circuits 82, harmonic filters 84, diplexers 86, and control circuits 88.

Although not illustrated in detail, the power amplifier may be a "smart" power integrated circuit, as is commonly understood, and may include a power circuit component configured to manage electrical power and at least one additional component configured to control, regulate, monitor, affect, or react to the operation of the power circuit. In practice, the power circuit component may include power transistors, and the at least one additional component may include, without limitation: a sensor (e.g., an environmental condition sensor, an electromagnetic sensor, an electromechanical sensor, an electrical attribute sensor, a transducer, or the like); a power control component; an analog component; a digital logic component; or any combination thereof.

During operation, referring to FIGS. 1 and 2, a differential or "balanced" signal is generated by transmitter electronics 22 and sent to the circuit 24 through the first and second balanced ports 38 and 40. As the differential signal passes through the balanced side 56 of the circuit 24, particularly the second winding 52 of the balun 42, inductive coupling occurs between the first and second windings 50 and 52 of the balun 42, causing the signal to be transformed into single-ended or "unbalanced" signal on the unbalanced side 54 of the circuit 24, as is commonly understood. The single-ended signal is sent through the first unbalanced port 34 of the transformer circuit 24 and amplified by the amplifier 26 before being sent to the antenna 28.

Figure 6:
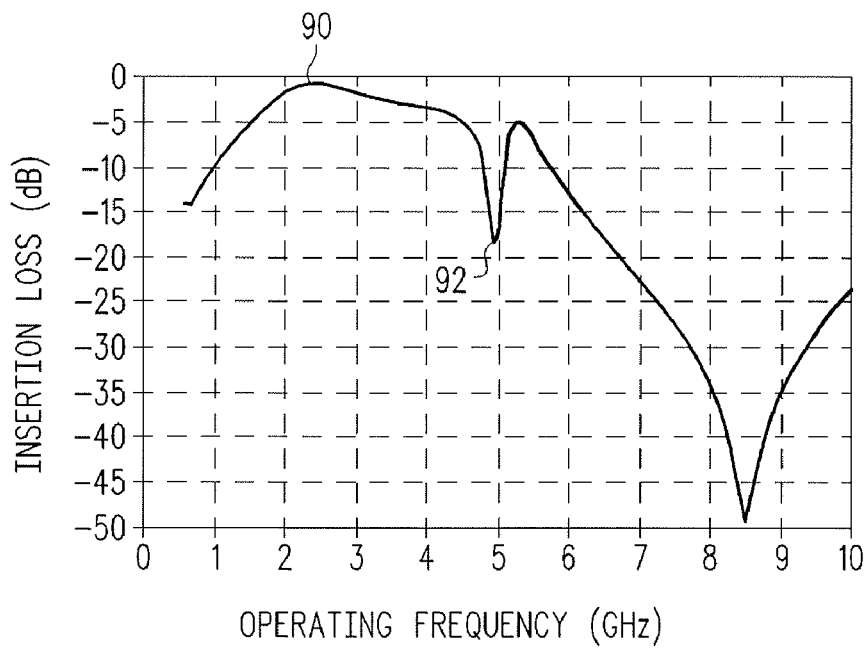
FIG. 6 is a graph comparing operating frequency to insertion loss of an embodiment of the present invention similar to that of FIG. 2.

FIG. 6 graphically illustrates the insertion loss (IL) of one experimental embodiment having one capacitor and one inductor within the reaction circuit. As shown, the transformer circuit (or harmonically suppressed balun transformer) operated at a fundamental frequency of 2.450 GHz, as indicated at peak 90, and experienced a notch 92 in the insertion loss at the second harmonic of the fundamental frequency, 4.900 GHz. The insertion loss was −0.537 decibels (dB) at the fundamental frequency and −19.441 dB at the second harmonic.

Figure 7:
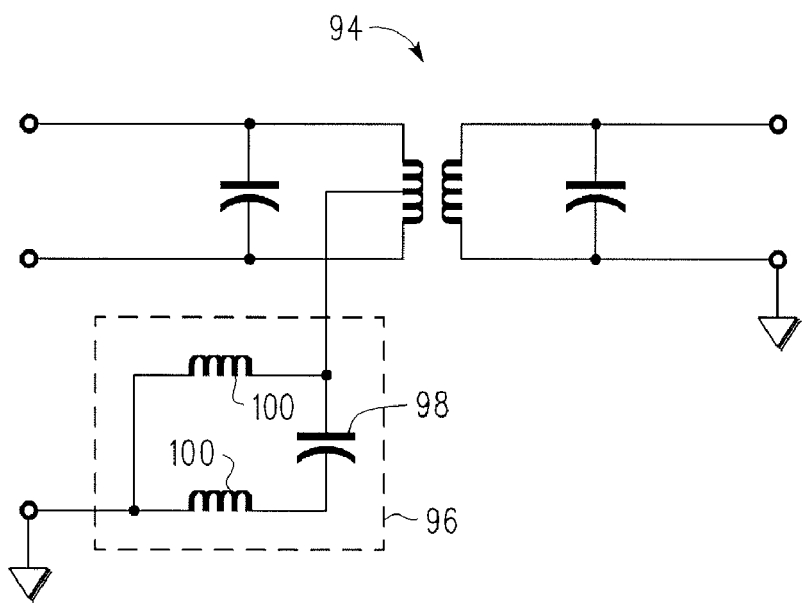
FIG. 7 is a schematic of a transformer circuit according to another embodiment of the present invention.
Figure 8:
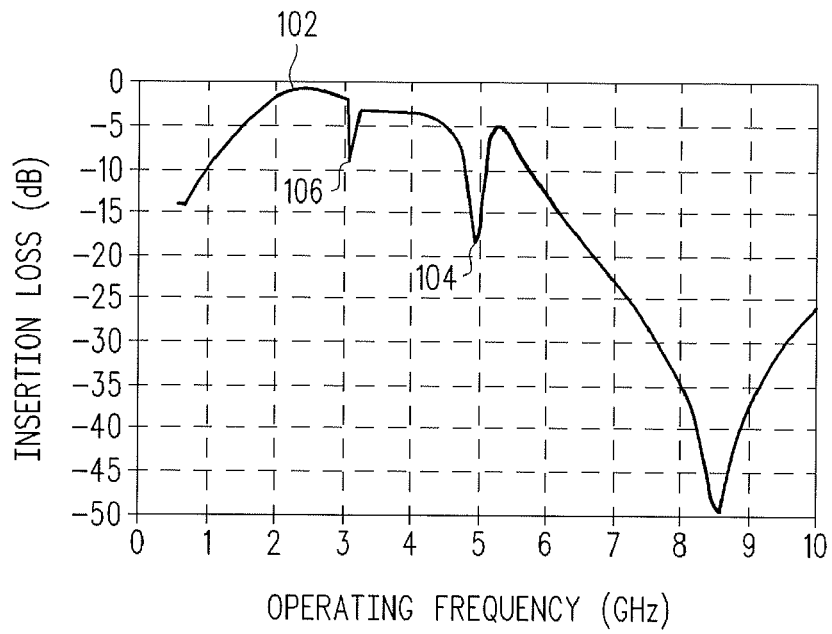
FIG. 8 is a graph comparing operating frequency to insertion loss of an embodiment of the present invention similar to that of FIG. 7.
Figure 9:
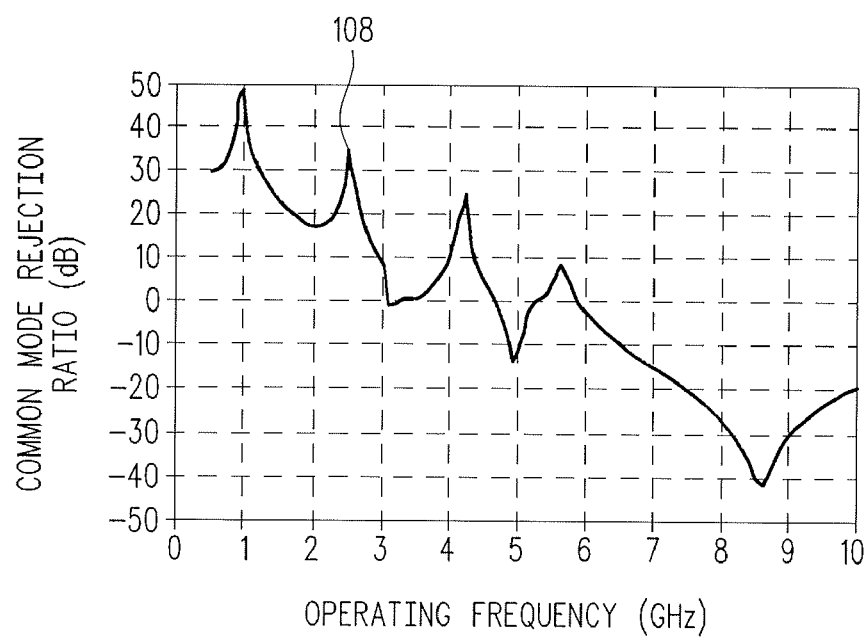
FIG. 9 is a graph comparing operating frequency to common mode rejection ratio of an embodiment of the present invention similar to that of FIG. 7.

FIG. 7 illustrates a transformer circuit 94 according to another embodiment of the present invention. The transformer circuit 94 may include many components similar to those of the transformer circuit 24 shown in FIG. 2. However, a reaction circuit 96 within the transformer circuit 94 shown in FIG. 7 includes a resonance capacitor 98 and two resonance inductors 100. FIG. 8 graphically illustrates the insertion loss of an experimental embodiment similar to that shown in FIG. 7. Similar to the embodiment of FIG. 6, the transformer circuit of FIG. 7 operated at a fundamental frequency of 2.450 GHz, as indicated at peak 102, and experienced a notch 104 at the second harmonic of the fundamental frequency, 4,900 GHz. The insertion loss was −0.585 decibels (dB) at the fundamental frequency and −18.447 dB at the second harmonic. It should also noted that a second notch 106 (i.e., caused by the second inductor) was experienced at approximately 3.100 GHz but did not affect the operation of the circuit at the fundamental frequency. FIG. 9 illustrates the common mode rejection ratio (CMRR) for the transformer circuit of FIGS. 7 and 8. As shown at peak 108, the CMRR for the transformer circuit was 27.754 dB and thus not adversely affected by the reaction circuit.

One advantage of the electronic assembly described above is that the reactive components within the reaction circuit cause the balun transformer to resonate at the second harmonic (or other selected harmonic) of its fundamental frequency. As a result, second harmonic rejection performance, as well as the overall performance of the device, is significantly improved. Another advantage is that the reactive components of the reaction circuit may be formed using conventional semiconductor processing steps and thus integrated with the other components of the device. Thus, the impact on the overall size and manufacturing costs of the device is minimized.

It should also be understood that the reaction circuit may also be used with receiver, as well as transceiver, systems, which may be similar to the transmitter system shown in FIG. 1, with the exception of the transmitter being replaced with a receiver or a transceiver. In an embodiment using a receiver, a singled-ended or "unbalanced" signal is received by an antenna and amplified by an amplifier before passing through an unbalanced port of the transformer circuit. As the single-ended signal passes through the unbalanced side of the circuit, inductive coupling occurs between the first and second windings of the balun, causing the signal to be transformed to a differential or "balanced" signal on the balanced side of the circuit, as is commonly understood in the art. The differential signal is sent through the balanced ports of the transformer circuit to the transmitter.

Other embodiments may include reactive components within the reaction circuit with electrical values selected such that the harmonic suppression occurs at harmonics other than the second harmonic, such as the third or fourth harmonic. The reaction circuit may be formed with only a single capacitor or inductor. For example, a single inductor may take the form of a wire bond sufficient in length to have a suitable inductance for the desired electrical effect. As will be appreciated, other manufacturing processes may be used to form the various components described above. As previously mentioned, active electric components, such as transistors and other integrated circuit components may be formed on the silicon substrate in conjunction with the passive electronic components.

An electronic assembly is provided. The electronic assembly comprises a substrate, a balun transformer formed on the substrate and including a first winding and a second winding, each having respective first and second ends, and a reaction circuit component formed on the substrate and electrically coupled to the second winding between the first and second ends thereof. The balun transformer and the reaction circuit component may jointly form a harmonically suppressed balun transformer having a fundamental frequency. The reaction circuit component may be tuned such that the harmonically suppressed balun transformer resonates at a selected harmonic of the fundamental frequency.

The selected harmonic frequency may be a second harmonic of the fundamental frequency. The reaction circuit component may include a capacitor. The reaction circuit component may be electrically coupled to a mid-point of the second winding.

The electronic assembly may also include an antenna electrically coupled to the first end of the first winding of the balun transformer. The electronic assembly may also include a ground terminal electrically coupled to the second end of the first winding of the balun transformer.

The second winding of the balun transformer may include a center tap and the reaction circuit component is electrically coupled to the second winding through the center tap. The electronic assembly may also include an amplifier electrically coupled to the first winding of the balun transformer. The resonant circuit component may also include an inductor. The substrate may include silicon, germanium, gallium arsenide, or a combination thereof.

An electronic assembly is provided. The electronic assembly includes a substrate, a balun transformer formed on the substrate and including a first winding and a second winding, each of the first and second windings having respective first and second ends, an antenna formed on the substrate and electrically coupled to the first end of the first winding of the balun transformer, a ground terminal on the substrate and electrically coupled to the second end of the first winding of the balun transformer, an amplifier electrically coupled to the first end of the first winding of the balun transformer, and a reaction circuit component formed on the substrate and electrically coupled to the second winding between the first and second ends thereof. The balun transformer and the reaction circuit component jointly form a harmonically suppressed balun transformer having a fundamental frequency. The reaction circuit component is tuned such that the harmonically suppressed balun transformer resonates at a selected harmonic of the fundamental frequency.

The reaction circuit component may include a capacitor. The selected harmonic may be a second harmonic of the fundamental frequency.

The electronic assembly may also include a transmitter on the substrate and electrically coupled to the first and second ends of the second winding of the balun transformer. The second winding of the balun transformer may include a center tap and the reaction circuit component is electrically coupled to the second winding through the center tap. The electronic assembly may also include a second ground terminal electrically coupled to the reaction circuit component.

A method for forming an electronic assembly is provided. A first winding is formed on a substrate. The first winding has first and second ends. A second winding is formed on the substrate. The second winding has first and second ends. The first and second windings jointly form a balun transformer. A reaction circuit component is formed on the substrate. The reaction circuit component is electrically coupled to the second winding between the first and second ends thereof. The reaction circuit component is tuned such that the balun transformer and the reaction circuit component jointly form a harmonically suppressed balun transformer having a fundamental frequency and that resonates at a selected harmonic of the frequency.

The reaction circuit component may include a capacitor. The selected harmonic frequency may be a second harmonic of the fundamental frequency. The method may also include forming an antenna on the substrate. The antenna may be electrically coupled to the first end of the first winding. The second winding may include a center tap, and the reaction circuit component may be electrically coupled to the second winding through the center tap.

While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described in an exemplary embodiment without departing from the scope of the invention as set forth in the appended claims and their legal equivalents.

What is claimed is:

1. An electronic assembly comprising:
   a substrate;
   a balun transformer formed on the substrate and comprising a first winding and a second winding, each having respective first and second ends; and
   a reaction circuit component formed on the substrate and electrically coupled to the second winding between the first and second ends thereof, wherein the balun transformer and the reaction circuit component jointly form a harmonically suppressed balun transformer having a fundamental frequency and the reaction circuit component is tuned such that the harmonically suppressed balun transformer resonates at a selected harmonic of the fundamental frequency, wherein the selected harmonic frequency is a second harmonic of the fundamental frequency, the reaction circuit component comprises a capacitor, and the reaction circuit component is electrically coupled to a mid-point of the second winding.

2. The electronic assembly of claim 1, further comprising an antenna electrically coupled to the first end of the first winding of the balun transformer.

3. The electronic assembly of claim 2, further comprising a ground terminal electrically coupled to the second end of the first winding of the balun transformer.

4. The electronic assembly of claim 3, wherein the second winding of the balun transformer comprises a center tap and the reaction circuit component is electrically coupled to the second winding through the center tap.

5. The electronic assembly of claim 4, further comprising an amplifier electrically coupled to the first winding of the balun transformer.

6. The electronic assembly of claim 5, wherein the resonant circuit component further comprises an inductor.

7. The electronic assembly of claim 6, wherein the substrate comprises silicon, germanium, gallium arsenide, or a combination thereof.

8. An electronic assembly comprising:
a substrate;
a balun transformer formed on the substrate and comprising a first winding and a second winding, each of the first and second windings having respective first and second ends;
an antenna formed on the substrate and electrically coupled to the first end of the first winding of the balun transformer;
a ground terminal on the substrate and electrically coupled to the second end of the first winding of the balun transformer;
an amplifier electrically coupled to the first end of the first winding of the balun transformer; and
a reaction circuit component formed on the substrate and electrically coupled to the second winding between the first and second ends thereof, wherein the balun transformer and the reaction circuit component jointly form a harmonically suppressed balun transformer having a fundamental frequency and wherein the reaction circuit component is tuned such that the harmonically suppressed balun transformer resonates at a selected harmonic of the fundamental frequency.

9. The electronic assembly of claim 8, wherein the reaction circuit component comprises a capacitor.

10. The electronic assembly of claim 9, wherein the selected harmonic is a second harmonic of the fundamental frequency.

11. The electronic assembly of claim 10, further comprising a transmitter on the substrate and electrically coupled to the first and second ends of the second winding of the balun transformer.

12. The electronic assembly of claim 11, wherein the second winding of the balun transformer comprises a center tap and the reaction circuit component is electrically coupled to the second winding through the center tap, and further comprising a second ground terminal electrically coupled to the reaction circuit component.

13. A method for forming an electronic assembly comprising:
forming a first winding on a substrate, the first winding having first and second ends;
forming a second winding on the substrate, the second winding having first and second ends, the first and second windings jointly forming a balun transformer;
forming a reaction circuit component on the substrate, the reaction circuit component being electrically coupled to the second winding between the first and second ends thereof;
tuning the reaction circuit component such that the balun transformer and the reaction circuit component jointly form a harmonically suppressed balun transformer having a fundamental frequency and that resonates at a selected harmonic of the frequency; and
forming an antenna on the substrate, the antenna being electrically coupled to the first end of the first winding,
wherein the reaction circuit component comprises a capacitor and the selected harmonic frequency is a second harmonic of the fundamental frequency.

14. The method of claim 13, wherein the second winding comprises a center tap and the reaction circuit component is electrically coupled to the second winding through the center tap.

* * * * *